US006553332B2

United States Patent
Leng

(10) Patent No.: US 6,553,332 B2
(45) Date of Patent: Apr. 22, 2003

(54) METHOD FOR EVALUATING PROCESS CHAMBERS USED FOR SEMICONDUCTOR MANUFACTURING

(75) Inventor: Yaojian Leng, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 163 days.

(21) Appl. No.: 09/727,186

(22) Filed: Nov. 30, 2000

(65) Prior Publication Data

US 2002/0065616 A1 May 30, 2002

Related U.S. Application Data

(60) Provisional application No. 60/171,719, filed on Dec. 22, 1999.

(51) Int. Cl.$^7$ .............................................. G06F 15/00
(52) U.S. Cl. ........................ 702/182; 702/182; 702/35; 438/9; 438/13; 438/924; 438/935; 700/121; 700/117; 700/203; 216/37; 216/55; 216/72
(58) Field of Search ............................... 702/35, 36, 40, 702/81–84, 98, 50, 108, 113–115, 117, 118, 135, 140, 170, 172, 182–185, FOR 188; 438/5, 12, 13, 17, 22, 26, 33, 36–39, 42, 44, 50, 905, 913, 924, 935, 970, 973, 975, 980, 689, 758; 73/31.06, 31.04, 777, 760, 763, 774, 700, 753, 754; 700/121, 301, 90, 95, 117, 197, 200, 203; 216/2, 37, 55, 56, 57, 58, 59, 72, 74

(56) References Cited

U.S. PATENT DOCUMENTS 6,136,388 A * 10/2000 Raoux et al. ............... 427/569

* cited by examiner

Primary Examiner—Hal Wachsman
Assistant Examiner—Elias Desta
(74) Attorney, Agent, or Firm—Yingsheng Tung; Wade James Brady, III; Frederick J. Telecky, Jr.

(57) ABSTRACT

A process chamber (12) is used for plasma etching of a wafer (21) disposed therein. A gas mixture supplied to the chamber eventually passes through openings (28) in a baffle plate (27). After the chamber has been cleaned, several test wafers are etched under conditions which are equivalent, except that a different gas pressure is used for each wafer. The effective etch rates are measured from these wafers, and used to extrapolate a reference curve (141) representing effective etch rate relative to pressure. During subsequent production use of the chamber, a similar procedure is periodically used to generate a test curve (142). The peak values (143, 144) of the reference and test curves are compared (147) to monitor process drift within the chamber. The peak values of respective curves obtained from two or more similar chambers can be compared to evaluate performance differences between the chambers.

13 Claims, 4 Drawing Sheets

METHOD FOR EVALUATING PROCESS CHAMBERS USED FOR SEMICONDUCTOR MANUFACTURING

This application claims priority under 35 USC §119(e)(1) of provisional application No. 60/171,719 filed Dec. 22, 1999.

TECHNICAL FIELD OF THE INVENTION

This invention relates in general to evaluation of process chambers used for semiconductor manufacturing and, more particularly, to chamber evaluation for purposes of monitoring process drift overtime, or for purposes of comparing two chambers to identify performance differences under equivalent process conditions.

BACKGROUND OF THE INVENTION

The manufacture of semiconductor devices typically involves process steps which are carried out on silicon wafers in process chambers, one example of which is an etching step. A typical processing chamber used for etching has a housing with a support therein, on which a silicon wafer can be placed. Gases are introduced into the chamber, and flow away from the region of the wafer through openings in a baffle plate. The pressure of the gases in the chamber is monitored at a location on a side of the baffle plate remote from the wafer.

As a series of selective oxide etch procedures are carried out within the chamber, polymer disposition will occur within the chamber over time, and will alter the process conditions within the chamber. For example, polymer deposition will occur within the openings in the baffle plate, thereby reducing the effective size of the openings, which in turn will increase the effective pressure differential between the gases on opposite sides of the baffle plate. Consequently, for a given measured pressure at the pressure sensor below the baffle plate, the actual pressure in the region of the wafer on the opposite side of the baffle plate will progressively increase over time as polymer deposits progressively increase within the openings in the baffle plate.

The progressive increase over time in the gas pressure in the region of the wafer causes a progressive decrease in the effective etch rate of wafers. At some point, the progressive decrease in the effective etch rate reaches a point where insufficient etching of a given wafer will occur, or in other words an etch stop condition will occur, resulting in defective semiconductor parts that must be discarded. As one specific example of this, an integrated circuit might include a dielectric layer, and a particular etch procedure might be intended to etch a via opening down through the dielectric layer to a conductive region immediately beneath the dielectric layer. Subsequent to the etch procedure, a plug of conductive material such as tungsten would be formed in the via opening, in electrical contact with the conductive region. However, as the effective etch rate decreases, it will reach a point where it fails to etch the via opening completely through the dielectric layer. Then, when the conductive plug is subsequently formed, it will not be in electrical contact with the underlying conductive region because there will be dielectric material between the conductive region and the lower end of the plug, as a result of which the particular device may be rendered inoperative.

In order to avoid problems of this type, process chambers are periodically cleaned. The most thorough cleaning procedure is commonly known as a wet cleaning procedure. A wet cleaning procedure can take about one day, and is relatively expensive because of direct costs such as the labor and parts involved, as well as indirect costs such as the fact that the process chamber is not available for revenue-producing production use. Due to the inconvenience and expense involved in a wet cleaning procedure, it is desirable to maximize the time interval between successive wet cleaning procedures. On the other hand, it is critical that this time interval not be too long, or else the process chamber will reach a point where the etching procedure is ineffective and results in defective wafers, as discussed above.

Various existing techniques have been developed to help determine when to initiate wet cleaning of a given process chamber. One such technique is to maintain a record of the number of hours of production use of the particular chamber since it was last subjected to a wet cleaning, and to initiate the next wet cleaning when the cumulative total reaches a specified value, such as 80 to 100 hours of production use. However, in this approach, the number of hours which triggers the initiation of the wet cleaning procedure must be selected to be a "safe" value which ensures that, even under worst-case chamber conditions, cleaning will occur before defective products are produced. Since actual chamber conditions are usually somewhat better than the worst-case scenario, it means that cleaning is normally triggered somewhat in advance of the time when it optimally should be triggered. This in turn means that this approach for determining when to clean a chamber is less than optimum because, on average, chamber cleaning consistently occurs too often. Stated differently, the average number of cleanings per year is greater than would be the case if cleaning were initiated in response to monitoring of actual process conditions within the chamber, and the greater average number of cleanings per year represents a greater average cost per year with respect to chamber cleaning.

A second technique for determining when to clean a chamber attempts to periodically test the actual process conditions within the chamber. More specifically, a single production type wafer is placed in the chamber and subjected to an etch procedure, and is then removed and cross-sectioned so that one via opening, or possibly several via openings, can be inspected to see if each such opening was etched completely through the particular layer in which it is being formed. However, cross-sectioning and inspecting a wafer is time-consuming, and may completely miss an etch stop problem present on the wafer. This is because etch stop may not occur uniformly across the wafer, and the one or two via openings selected for inspection may be openings other than those that experienced etch stop.

Another technique commonly used in the art is to put a single test wafer in the test chamber and subject it to the etch procedure, but instead of via openings having a critical dimension (CD) or diameter of a production size, it has one or more etch regions with dimensions that are many times larger than the CD of a typical via opening. For example, each such etch region may have an area with a size on the order of 100 microns by 100 microns. Because the etch regions are much larger than an actual via opening, they do not provide a fully accurate picture of whether an etch stop problem may actually be occurring within via openings of production wafers. This is because the actual etching conditions which exist within a via opening of relatively small CD are significantly different from the actual etching conditions which exist for a relatively large test etch surface with an area that has a size on the order of 100 microns by 100 microns. As a consequence, the actual etch conditions within a via opening of relatively small CD cannot be accurately judged on the basis of a relatively large test etch region.

As to both of these techniques which use test wafers, a further disadvantage is that it is common in the art to carry out this type of etch rate qualification on a separate basis for each different production process that is run in the particular process chamber, which is time-consuming and expensive. Moreover, as to a given production process, both of these techniques look only at an effective etch rate for a single wafer etched under a single set of process conditions, which is insufficient information to provide a fully accurate indication of the degree of process drift within the chamber.

Still another existing approach is to upgrade the hardware of a given chamber by adding a second pressure sensor on the side of a baffle plate opposite from the existing pressure sensor, or in other words on the side of the baffle plate nearest the wafer. This permits feedback control based on the actual pressure in the region of the wafer during an etch procedure. However, the hardware upgrade itself is relatively expensive, and in fact typically involves tens of thousands of dollars for each chamber. In addition, the added pressure sensor must be periodically cleaned in order to avoid inaccurate readings. Further, existing test chambers often have a ring of magnets that encircles the wafer and rotates slowly in order to facilitate confinement of the plasma in the chamber. This rotating magnet ring causes fluctuations of the plasma within the chamber, in a manner which results in varying conditions at the extra sensor that effectively add a level of uncertainty or "noise" to the readings from the sensor.

Separately from the issue of determining the condition of a given chamber is the issue of chamber matching. More specifically, an actual production environment will typically involve the provision of a plurality of process chambers that are structurally identical and that can be operated under theoretically identical process conditions, but which in reality have differences in performance even when operated under theoretically identical conditions. Consequently, it is desirable to be able to accurately compare the performance of two or more similar chambers being operated under equivalent conditions, and then have the option of adjusting conditions for one or both chambers so as to reduce or eliminate any detected mismatch in their performance. With reference to the above discussion of the use of production or test wafers to measure an effective test rate, shortcomings of the type discussed above with respect to process drift also limit the usefulness of these techniques with respect to comparison of chamber performance.

In view of the foregoing discussion, it will be recognized that existing techniques for evaluating process drift and for comparing performance of multiple chambers have been generally adequate for their intended purposes, but have not been satisfactory in all respects.

SUMMARY OF THE INVENTION

From the foregoing, it may be appreciated that a need has arisen for a method of accurately monitoring process conditions in a process chamber used for semiconductor manufacturing, in a manner which is inexpensive, fast, reliable and accurate.

According to a first form of the present invention, a method is provided to address this need, and involves monitoring a process drift in a process chamber by: successively introducing a plurality of test wafers into the process chamber, and etching each test wafer under a respective set of chamber conditions which are substantially the same except that each set involves use of a respective different gas pressure within the chamber; determining for each test wafer an effective test etch rate thereof; extrapolating from the test etch rates and respective corresponding gas pressures a test curve representing variation of test etch rate relative to gas pressure; and comparing the test curve to a reference curve in order to determine a relative pressure offset therebetween, the pressure offset being representative of a degree of process drift occurring within the chamber.

A different form of the present invention involves matching etch performance in first and second process chambers by: successively introducing a plurality of first test wafers into the first process chamber and etching each of the first test wafers under a respective set of chamber conditions which are substantially the same except that each set involves use of a respective different gas pressure; and successively introducing a plurality of second test wafers into the second process chamber and etching each of the second test wafers under a respective set of chamber conditions which are substantially the same except that each set involves use of a respective different gas pressure. Then, the method involves: determining for each of the first and second test wafers an effective test etch rate thereof; extrapolating from the test etch rates and respective corresponding gas pressures for the first test wafers a first test curve representing variation of test etch rate relative to gas pressure for the first chamber; extrapolating from the test etch rates and respective corresponding gas pressures for the second test wafers a second test curve representing variation of test etch rate relative to gas pressure for the second chamber; and comparing the first test curve to the second test curve in order to determine a relative offset therebetween which represents an operational difference between the first and second chambers.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
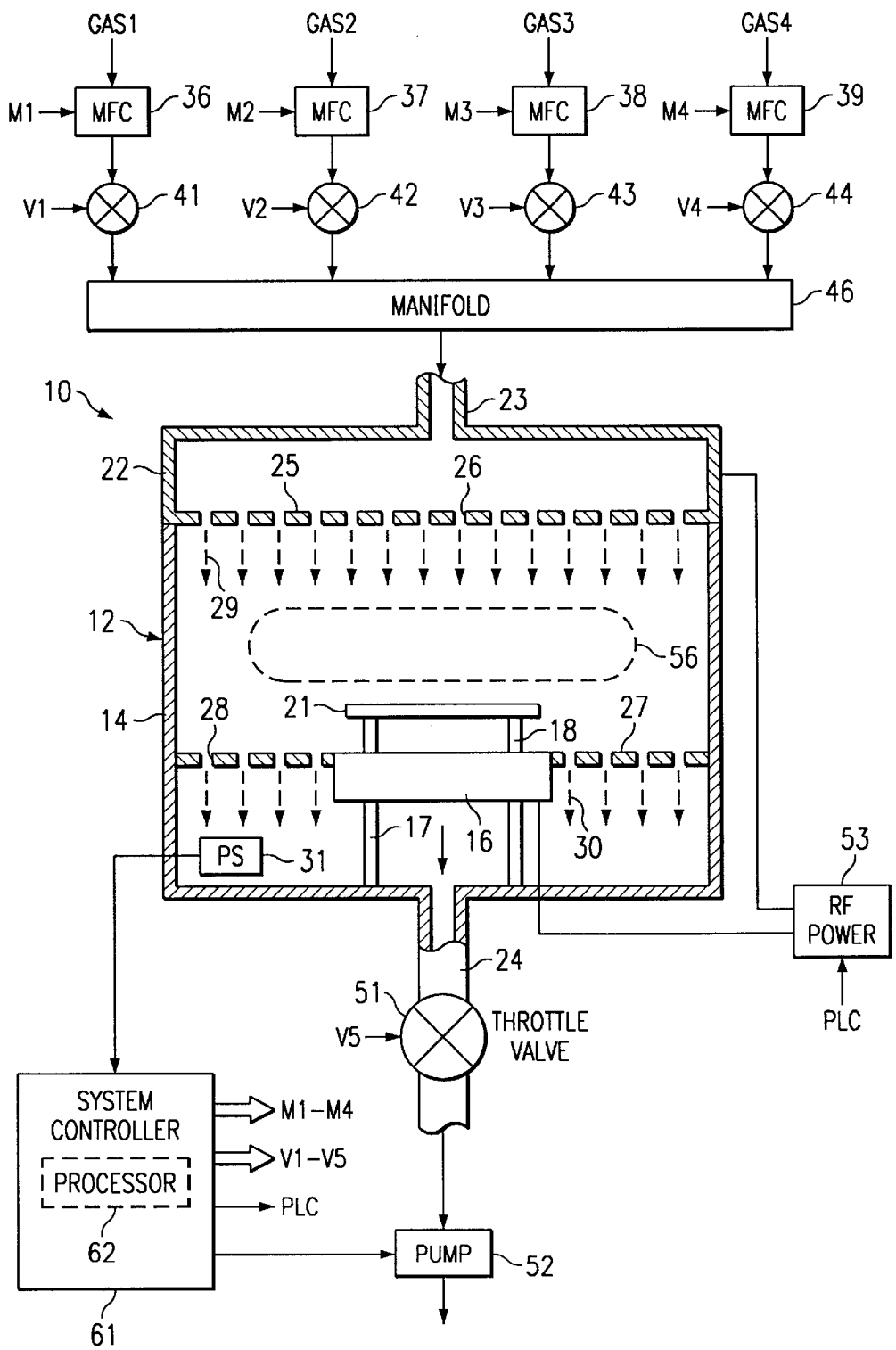
FIG. 1 is a diagrammatic view of a system which includes a process chamber used to manufacture semiconductor devices, and which is utilized in carrying out methods that embody features of the present invention.

FIG. 1 is a diagrammatic view of a system 10 to which the principles of the present invention can be applied. The system 10 is used for manufacturing semiconductor devices. The system 10 includes a process chamber 12, which is used for certain steps in the processing of silicon wafers during the fabrication of semiconductor devices on the wafers. As one example, the chamber 12 may be used to carry out an etching process.

The chamber 12 includes a housing 14 having a cylindrical side wall, and having a bottom wall. In the disclosed embodiment, the housing 14 is made of aluminum, but could alternatively be made of a ceramic material. A cylindrical wafer support 16 is provided centrally within the housing 14, and serves as a lower electrode assembly. The wafer support 16 is supported on the floor of the housing 14 by several vertical legs 17. The wafer support 16 has on its upper side several vertical pins 18, which can support a flat, circular silicon wafer 21 of a known type. The wafer 21 can be introduced into and removed from the housing 14 through an access arrangement which is known in the art, and which is therefore not illustrated and described in detail. The wafer may be held in position on the wafer support 16 by an electrostatic chuck, which is not separately illustrated. Further, the wafer support 16 may include structure which provides cooling to the wafer, and which is also not separately illustrated.

The top of the process chamber 12 is defined by a cylindrical upper electrode assembly 22, which sealingly engages the top of the housing 14, and effectively serves as a top wall of the housing. The upper electrode assembly 22 has a recess therein, and has a bottom wall 25 with a plurality of vertical openings 26 therethrough The upper electrode assembly is sometimes referred to as a nozzle and, in FIG. 1, is of a type referred to in the art as a showerhead nozzle. This particular electrode assembly is depicted by way of example, and the invention encompasses the use of other types of electrode assemblies.

The chamber 12 has an inlet conduit 23 which opens into the electrode assembly 22, and an outlet conduit 24 which opens through the center of the bottom wall of the housing 14. An annular baffle plate 27 encircles the wafer support 16, the baffle plate extending radially from the wafer support 16 to the housing 14, adjacent the upper end of the wafer support 16. The baffle plate 27 has a plurality of vertical openings 28 through it. A gas mixture is supplied through the inlet conduit 23 to the interior of the upper electrode assembly 22, in a manner explained later. The mixture passes through the openings 26 in the upper electrode assembly as indicated diagrammatically by arrows 29, and later passes through the openings 28 in the baffle plate 27, as indicated diagrammatically at 30. A pressure sensor (PS) of a known type is provided within the process chamber 12 below the baffle plate 27, as indicated diagrammatically at 31.

Four gas sources GAS1, GAS2, GAS3 and GAS4 each supply a respective different type of gas to a manifold 46 through a respective mass flow controller (MFC) 36–39 and a respective on/off inlet valve 41–44. The manifold 46 has an outlet which is in fluid communication with the inlet conduit 23 of the housing 14. In the disclosed embodiment, the respective gases from the gas sources GAS1, GAS2, GAS3 and GAS4 are $C_4F_8$, $O_2$, CO and Ar, but other gases could alternatively be used.

Although FIG. 1 depicts four gas sources GAS1, GAS2, GAS3 and GAS4 which each communicate with the manifold 46 through a respective MFC and valve, it will be recognized that a larger or smaller number of gas sources could be provided, where each gas source communicates with the manifold through a respective MFC and valve. In addition, although FIG. 1 shows that each gas source is coupled to the manifold 46 through a respective MFC and valve, it will be recognized that there are other configurations of components which are capable of mixing gases from multiple sources and supplying them to the inlet conduit 23.

In FIG. 1, the outlet conduit 24 of the housing 14 is coupled in sequence to a throttle valve 51, and then to a vacuum pump 52. Other not-illustrated devices, such as an isolation valve, may be coupled in series with the valve 51 and pump 52, either before or after the throttle valve 51, or after the pump 52, as appropriate. In the disclosed embodiment, the throttle valve 51 is a variable valve, the degree of opening of which can be adjusted through a range of positions from fully open to fully closed.

A radio frequency (RF) power source 53 has two output terminals that are respectively coupled to the upper electrode assembly 22, and to the lower electrode assembly 16, which is the wafer support. The power source 53 thus can apply an RF potential between the wafer support 16 and the upper electrode assembly 22. The level of RF power applied by the source 53 is variable, and in the disclosed embodiment is typically in the range of about 1,500 watts to 2,000 watts. As is known in the art, the RF power from the source 53 helps to strike and maintain a gas plasma between the electrode assembly 22 and the wafer 21, the gas plasma being shown diagrammatically by broken lines at 56 in FIG. 1.

The chamber 12 has a not-illustrated ring of magnets which encircles the wafer and is slowly rotated. This rotating ring of magnets facilitates confinement of the plasma 56. The ring of magnets and its rotation are known in the art, and are therefore not illustrated and described in further detail here.

A system controller is shown diagrammatically at 61 in FIG. 1, and includes a digital processor 62. Although the system controller 61 is depicted in FIG. 1 as a single unit, it will be recognized that the system controller 61 may actually be implemented in the form of several separate control units that communicate with each other and that carry respective portions of the processing load. For convenience, however, the system controller 61 is shown as a single unit in FIG. 1. The system controller 61 is a known type of component, and is therefore not illustrated and described in detail.

The system controller 61 generates a plurality of valve control signals V1–V5, which are respectively supplied to the valves 41–44 and 51. The system controller 61 also generates a plurality of MFC control signals M1–M4, which are respectively coupled to the MFC's 36–39. In addition, the system controller 61 generates a power level control signal PLC, which is coupled to and controls the RF power source 53. Further, the system controller 61 generates a pump control signal, which is supplied to and controls the vacuum pump 52.

When the system 10 of FIG. 1 is in a production mode of operation, it will typically process silicon wafers 21 during successive production intervals, which are spaced from each other in time by non-production intervals that are also part of the production mode of operation. During a production interval, the system 10 will typically process several wafers 21 in sequence. During non-production intervals, the process chamber 12 is not processing wafers, but is maintained in a production-ready state, so that the next production interval can commence without any significant delay. Production intervals are normally used to produce actual working semiconductor devices, which may be sold to customers or used in some other appropriate manner. However, and as discussed below, selected production intervals will be periodically used for test purposes to monitor chamber performance, such as the degree of process drift in the chamber.

In this regard, during a production interval, gases from the sources GAS1-GAS4 are mixed in a selected ratio within the manifold 46, the ratio being controlled by appropriate operation of the MFCs 36–39 under control of the system controller 61. In a known manner, each MFC 36–39 causes the corresponding gas to flow through it at a specified rate, the specified rate being identified in units which are known in the industry as standard cubic centimeters per minute (SCCM). The resulting mixture of gases is then supplied through the inlet conduit 23 to the upper electrode assembly 22.

The system controller 61 also controls the throttle valve 51 in a manner so that the gas mixture within the lower portion of the chamber 12 has a selected pressure. More specifically, the system controller 61 effects feedback control of the gas pressure within the chamber 12 by monitoring this pressure using the pressure sensor 31, and by then controlling the throttle valve 51 so that the selected pressure is present at the pressure sensor 31.

The gas mixture within the electrode assembly 22 flows through the openings 26 in a direction toward the wafer 21, as indicated diagrammatically at 29. Due to the fact that the RF power source 53 is applying an RF potential between the upper electrode assembly 22 and the wafer support 16, the gas mixture between the electrode assembly 22 and the wafer 21 strikes a plasma, as indicated diagrammatically at 56. The openings 26 in the wall 25 do not necessarily have a uniform size and spacing. Instead, they will typically have various sizes and spacing in a configuration that is intended to ensure a relatively uniform characteristic throughout the plasma 56, so as to achieve etching of the wafer 21 at a uniform rate across the entire top surface of the wafer 21.

In due course, the gas mixture in the chamber flows from the region of the wafer 21 through the openings 28 in the baffle plate 27, to the region of the pressure sensor 31 below the baffle plate 27. The openings 28 in the baffle plate 27 do not necessarily have a uniform size and spacing. Instead, they will typically have various sizes and spacing in a configuration that is intended to ensure a relatively uniform characteristic throughout the plasma 56, so as to achieve etching of the wafer 21 at a uniform rate across the entire top surface of the wafer 21. Gases within the chamber 12 ultimately flow out of the chamber through the outlet conduit 24.

It will be recognized that, since the gas mixture within the chamber 12 must flow through the openings 28 in the baffle plate 27, there will inherently be a pressure difference between opposite sides of the baffle plate 27. In particular, the pressure above the baffle plate 27 will be somewhat higher than the pressure below the baffle plate 27. When the process chamber 12 is clean, the normal expected value of this pressure difference will be on the order of about 10 mTorr, depending on factors such as the total gas flow, the pressure, and the other process conditions. However, as the chamber 12 is used after it has been cleaned, deposits will form over time within the chamber. For example, in a selective oxide etch process, polymer deposits will occur on interior surfaces of the chamber, and will alter the chamber condition. In this regard, polymer deposits will form within the openings 28 of the baffle plate 27, and will slowly decrease the size of the openings 28. It will be recognized that this will in turn increase the pressure difference across the baffle plate 27.

As discussed above, the system controller 61 uses the pressure sensor 31 to monitor the gas pressure within the chamber 12, at a location below the baffle plate 27. The system controller 61 is programmed so as to take into account the normal pressure differential across the baffle plate 27. However, as discussed above, polymer deposits within the openings 28 can increase the pressure difference across the baffle plate 27. As a result, for a given pressure established below the baffle plate 27 by the system controller 61, based on feedback from the sensor 31, the progressive increase of polymer deposits within the openings 28 will cause the gas pressure above the baffle plate 27, in the region of wafer 21, to progressively increase. The etch rate in an etching procedure is dependent on pressure, and the increase in gas pressure above the baffle plate 27 thus causes process drift, such as a decrease in the effective etch rate at the wafer 21. When the etch rate decreases, the wafer 21 in the chamber is etched to a lesser degree than intended.

For example, and as mentioned earlier, a given etch procedure may be intended to etch a via opening completely through a dielectric material to a contact pad. However, a reduced etch rate may prevent the etch process from etching the via opening all the way through the dielectric material to the contact pad. As a result, subsequent formation in the via opening of a conductive plug will not result in electrical contact between the plug and the contact pad.

Due to the foregoing problems associated with progressive deposits of material within the chamber during normal use for etching, process chambers of the type shown at 12 in FIG. 1 must be periodically taken out of the production mode, opened or disassembled, and subjected to a wet clean procedure, where the chamber parts are cleaned with a liquid such as de-ionized water or isopropyl alcohol. In addition, a number of chamber parts are typically replaced at the time of a wet clean procedure. A wet clean procedure may take an entire day, during which the process chamber is not available for production use. It is thus desirable to perform wet clean procedures as infrequently as possible. As a consequence, it is desirable to be able to monitor the extent to which process drift may actually be occurring within a given chamber as a result of progressively increasing deposits, so that a wet clean procedure can be performed before wafer defects occur, but without performing wet clean procedures more often than necessary. As discussed in more detail below, one feature of the invention is an accurate and effective method of monitoring process drift in a process chamber for purposes of determining when it is appropriate to perform a wet clean procedure.

A further consideration is that a given production facility may include several identical process chambers of the type shown at 12 in FIG. 1. Even though these multiple process chambers are all supposed to be identical, and even though the respective system controllers 61 for these chambers are all given identical process control instructions, the actual process conditions within each chamber may still not be identical in practice. Accordingly, there is a need to be able to characterize the differences in chamber performance between two or more equivalent chambers, with the option of adjusting the process conditions for one or more of the chambers in a manner so as to reduce any detected mismatch. A feature of the invention, discussed in more below, is the provision of capability to characterize relative chamber performance of two or more chambers, and optionally adjust process conditions in a manner reducing the detected mismatch.

Figure 2:
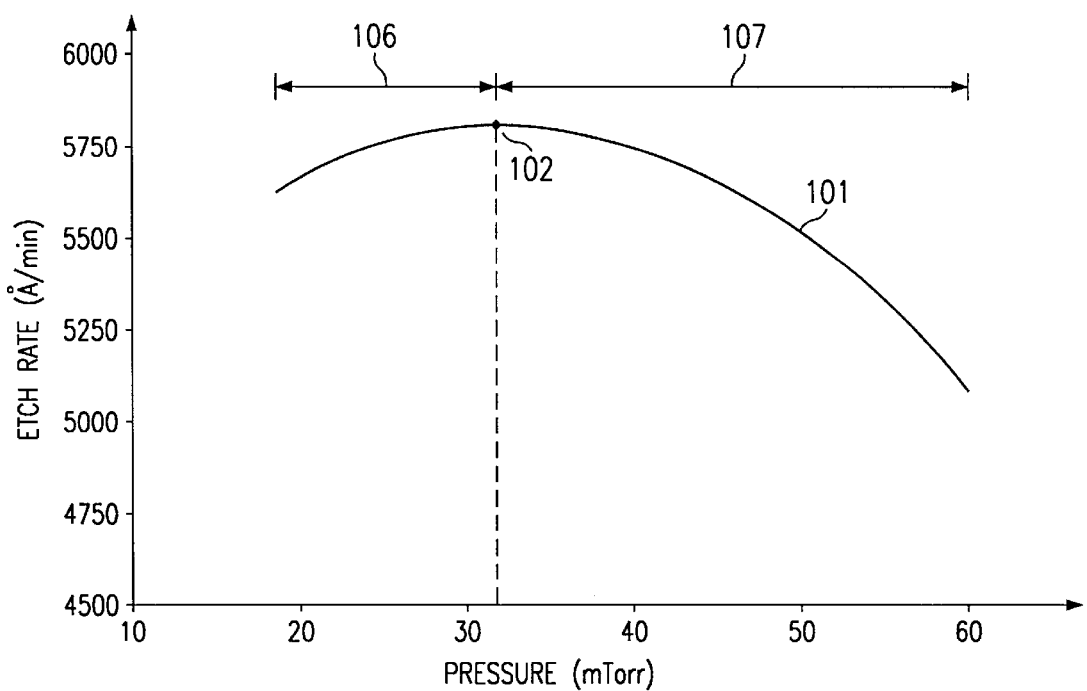
FIGS. 2–6 are graphs of one or more curves which each correspond to a process chamber of the type shown in FIG. 1, and which each show a relationship between etch rate and pressure for a given set of process conditions.

FIG. 2 is a graph of a nonlinear curve 101 that represents how the etch rate within a process chamber varies as a function of variations in the pressure of gases within the chamber, where process conditions other than the gas pressure do not change. The curve 101 in FIG. 2 has a shape which is very close to being parabolic. In this regard, it will be noted that the curve 101 in FIG. 2 has a peak value at 102, and that the etch rate decreases progressively from the peak value 102 in both direction along the curve 101. The reason for the peak value 102 is as follows.

As is known in the art, plasma etching is achieved by a combination of ion sputtering and chemical reaction. The ion sputtering increases with a decrease in pressure, whereas the chemical reaction increases with an increase in pressure. Thus, in the region of the curve 101 to the left of the peak value 102, or in other words the pressure region 106, ion sputtering dominates, but the chemical reaction is significantly reduced. In contrast, in the region of the curve 101 to the right of the peak value 102, or in other words the pressure region 107, the chemical reaction is effective but the ion sputtering is reduced. The peak value 102 represents the optimum pressure point at which the combined effects of the ion sputtering and the chemical reaction maximize the effective etch rate. The present invention recognizes that the peak value 102 corresponding to this optimum pressure is a unique value on the curve 101, and can be used to characterize the particular chamber.

Figure 3:
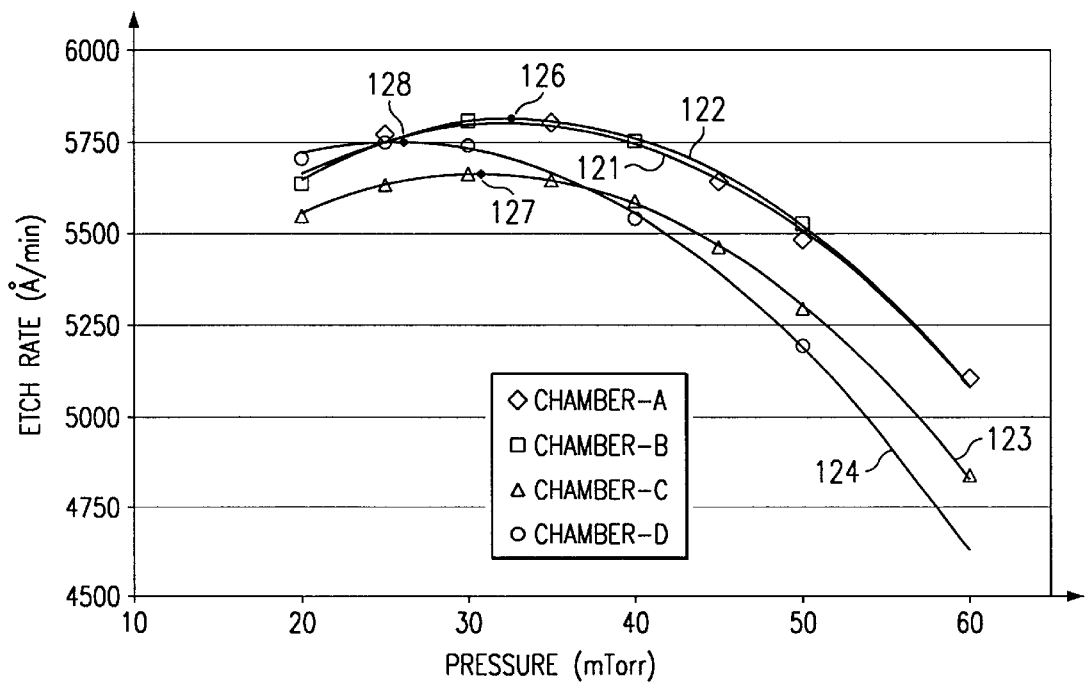

In this regard, the present invention includes recognition of the fact that the shape of the curve 101 is intrinsic to the etching process, and independent of the chamber conditions. In this regard, FIG. 3 is a graph similar to the graph of FIG. 2, but showing four curves 121–124 which each correspond to a respective one of four different process chambers that are structurally similar. The curve 121 was generated by successively placing five test wafers in a first of the four process chambers, and by carrying out an etching procedure on each wafer under process conditions that were identical except for pressure. In particular, each of the five wafers was subjected to the etch procedure at a respective different pressure, as measured at the pressure sensor 31 (FIG. 1). Even though the pressure was varied, the same gas flow rate was used at each of the different pressures.

After etching of the wafers, at least one etch region on each wafer was inspected to determine the effective etch rate of that wafer. The etch regions on these wafers, which may alternatively be referred to as thin film monitor boxes, each have an area with a size on the order of 100 microns by 100 microns. Even though these etch regions have areas that are many times larger than certain structural components of an actual integrated circuit, such as a via opening with a relatively small critical dimension (CD) or diameter, the present invention nevertheless provides a very accurate assessment of the effective etch rate. The inspection of the etch regions is carried out using an existing measurement tool of a type which is known to those skilled in the art, and which is commonly used in the art to measure oxide thicknesses.

Next, a respective point was plotted in the graph of FIG. 3 for each wafer etched in the first chamber, identifying the effective etch rate for that wafer with respect to the corresponding gas pressure. For the first chamber, these five points are identified by the five diamonds in FIG. 3. The curve 121 was then extrapolated from the five plotted points, so as to pass through or at least close to each of these points. For convenience, the disclosed embodiment starts with a parabolic curve and fits it as closely as possible to the plotted points, but it will be recognized that there are other curve fitting techniques which could be utilized in association with the present invention. The other three curves 122–124 were each generated in manner similar to that used for the curve 121, but for a respective different process chamber. At first glance, it does not appear that all four curves 121–124 in FIG. 3 are identical. In particular, although curves 121 and 122 substantially overlie one another, and curve 123 has a similar shape, curve 124 appears to be somewhat different. However, all four curves 121–124 actually have a virtually identical shape.

Figure 4:
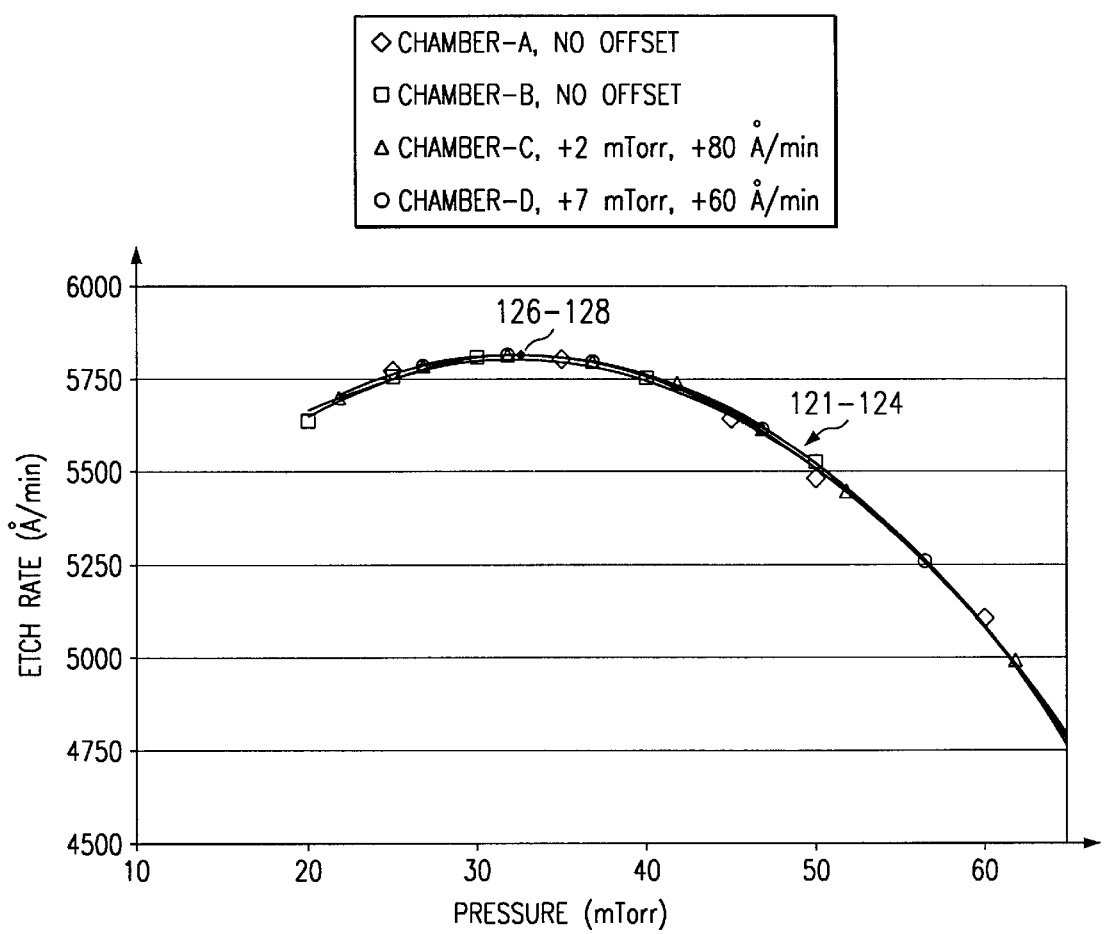

In order to demonstrate this, it is possible to identify the peak value for each curve. In FIG. 3, the peak values for each of curves 121 and 122 are identified by a common point 126, the peak value for the curve 123 is identified by a point 127, and the peak value for curve 124 is identified by a point 128. If the curves 123 and 124 are shifted horizontally and vertically on the graph of FIG. 3, so that their peak values 127 and 128 each lie directly over the peak value 126 for the curves 121 and 122, the result is as shown in FIG. 4. FIG. 4 clearly demonstrates that the curves 121–124 all have an identical shape which, as mentioned above, is intrinsic to the process, independent of any particular chamber, and independent of the process conditions. As to process conditions, variation of certain process conditions such as pressure will shift the position of the curve on the graph, but do not change its shape.

Figure 5:
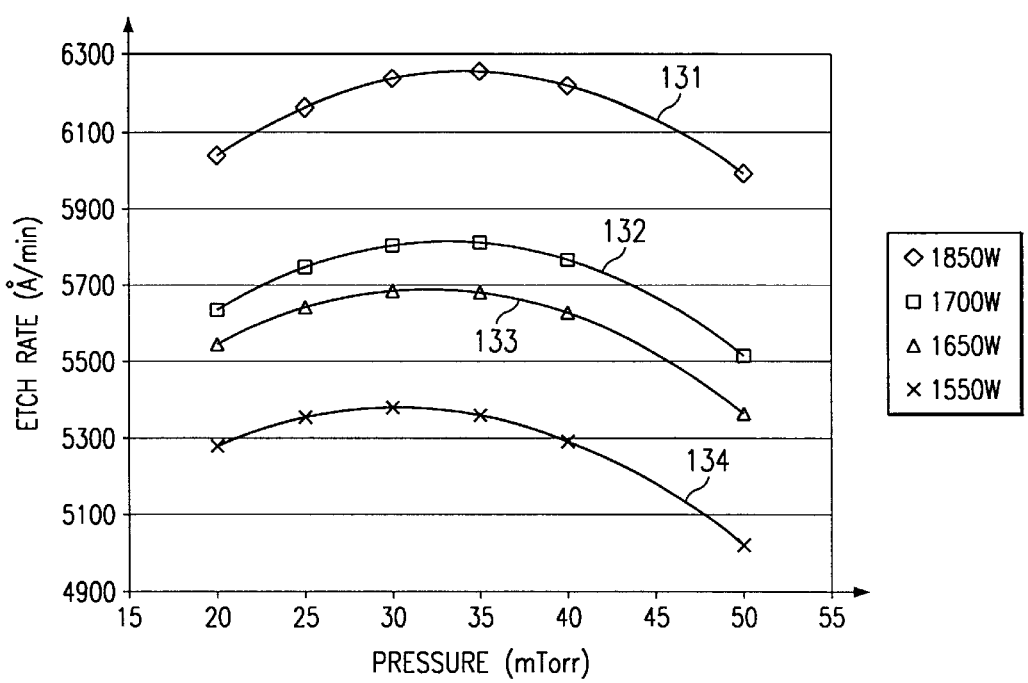

FIG. 5 is a graph which, like FIGS. 2–4, shows etch rate relative to pressure, and depicts four curves 131–134 that all correspond to a single process chamber. The curves 131–134 have each been generated in a manner similar to that described above with respect to the curve 121 of FIG. 3. The difference between the curves 131–134 is that each corresponds to use of a different power level from the RF power source 53 (FIG. 1). In particular, the curves 131–134 correspond to respective power levels of 1,850 watts, 1,700 watts, 1,650 watts, and 1,550 watts. It is self-evident from FIG. 5 that the curves 131–134 all have substantially the same shape. The point conveyed by FIG. 5 is that the level of RF power from the source 53 is a process condition that can be varied in order to increase or decrease the effective etch rate. Stated differently, variation of the RF power level will move a curve vertically in the graph. Variation of other process conditions, such as the gap between the upper electrode assembly 22 and the wafer 21, can also affect the effective etch rate, but RF power is a parameter that can be easily and conveniently controlled in order to adjust the etch rate.

Referring again to FIG. 3, and as explained above, each of the curves 121–124 in FIG. 3 corresponds to a respective different one of four process chambers, where the process conditions are effectively the same, except for variations in the gas pressure supplied to the electrode assembly 22 through the inlet conduit 23. Consequently, by generating the curves of FIG. 3 in the manner described above, and by identifying the respective peak value 126–128 for each of these curves, the peak values can then be compared in order to characterize differences which exist in the performances of these four chambers, even though these four similar chambers should theoretically be providing equivalent performances.

As a further optional step, adjustments can be made to the process conditions of at least one of the four chambers in a manner so as to reduce or eliminate any detected mismatch between chambers. For example, with respect to the curves 121 and 123 in FIG. 3, the performance mismatch between chambers can optionally be reduced or eliminated by effecting movement of the curve 123 so that its peak value 127 is coincident with the peak value 126 of the curves 121 and 122. This requires an upward shift of the curve 123 and its peak value 127, which can be effected by increasing the RF power level for the chamber associated with curve 123, as discussed above in association with FIG. 5. It also requires a horizontal shift of the curve 123 and its peak 127, which can be effected by adjusting the setting of the throttle valve 51, so as to change the pressure in the region of the wafer 21.

It would alternatively be possible to effect an adjustment corresponding to only one of the horizontal axis and vertical axis. According to the present invention, an adjustment could be made only with respect to the horizontal axis, or in other words with respect to effective pressure.

Figure 6:
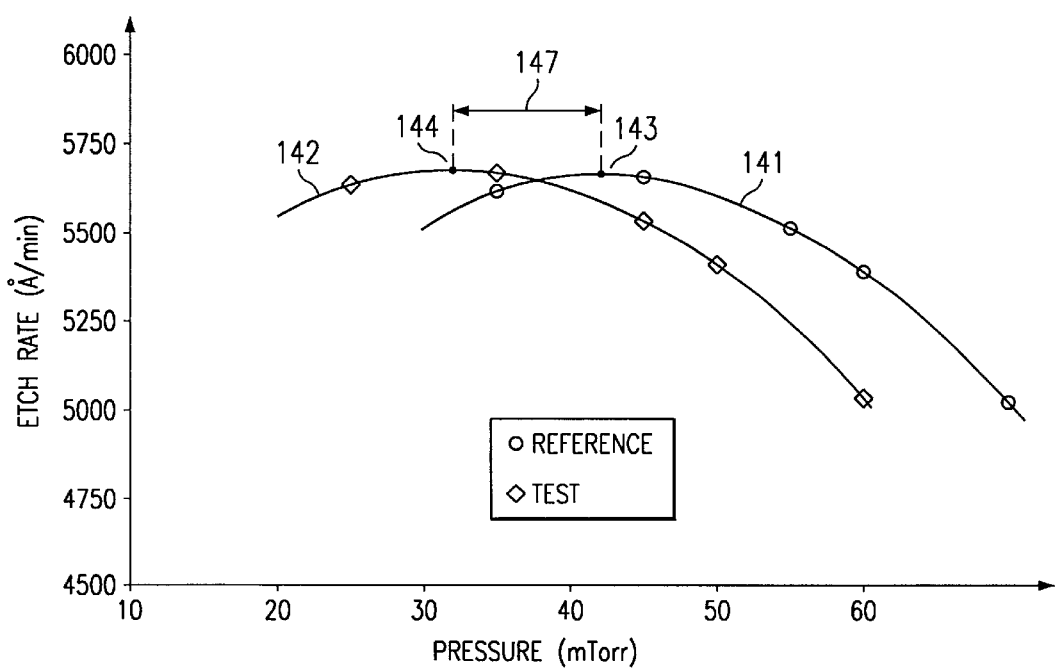

As mentioned above, a further feature of the invention is the provision of the capability to accurately monitor a process drift within a given chamber, for example for the purpose of determining when the chamber has reached a point where a wet clean is needed. In this regard, shortly after a wet clean has been completed for a given chamber, a reference curve is generated for the chamber in a manner similar to that described above for generation of the curve 121 of FIG. 3. FIG. 6 is a graph showing at 141 an exemplary reference curve for the chamber 12 of FIG. 1. After a cleaning of the chamber 12, and generation of the reference curve 141, the chamber 12 is returned to normal production use.

Periodically, the production use of the chamber 12 is briefly interrupted in order to carry out a test procedure which generates a test curve for the chamber 12, one example of which is shown at 142 in FIG. 6. The test curve 142 is generated using the same sequence of steps that were used to generate the reference curve 141. The reason the curves 141 and 142 do not directly overlie one another is that, as discussed above, use of the chamber 12 for production purposes causes a progressive increase in polymer deposits within the openings 28, which in turn causes a progressive decrease in the effective size of openings 28. The decrease in the effective size of the openings 28 causes an increase in the pressure differential on opposite sides of the baffle plate 27, which in turn means an increase in the effective pressure above the baffle plate 27 in the region of the wafer 21. This causes an effective leftward shift of the measured curve within the graph. Stated differently, each successive test curve 142 will have the same shape as the reference curve 141, but will be slightly further to the left.

To demonstrate why this is the case, assume that the peak value 143 of the reference curve 141 and the peak value 144 of the reference curve 142 each represent effectively equivalent process conditions at a location between the baffle plate 27 and the wafer 21, but that the peak value 143 corresponds to a situation where the baffle plate 27 is clean and the openings 28 have no deposits in them, whereas the peak value 144 corresponds to a situation where the openings 28 in the baffle plate 27 have a reduced effective size due to deposits therein. The horizontal axis of the graph of FIG. 6 represents the pressure as measured by the pressure sensor 31, or in other words the pressure below the baffle plate 27. Consequently, if a given pressure above the baffle plate 27 corresponds to a first pressure at the sensor 31 when the openings 28 are clean, then when there are deposits in the openings 28, it will be necessary to have at the sensor 31 a second pressure which is lower than the first pressure, in order to achieve the same effective pressure above the baffle plate 27. As a result, the peak value 143, which corresponds to clean openings 28, is aligned with the first pressure on the horizontal axis, whereas the peak value 144, which corresponds to openings with deposits, is aligned with the lower second pressure on the horizontal axis.

The pressure difference 147 between the peak values 143 and 144 increases progressively during use of the chamber, as the amount of time since the last wet clean progressively increases. The difference 147 is thus a highly accurate measure of the actual degree of the process drift within the chamber, and also permits effective pressure drift to be monitored independently of other factors. The magnitude of the difference 147 can be compared to a predetermined threshold value and, when the difference 147 exceeds the threshold value, the chamber can be subjected to a wet clean in order to remove the deposits which have been formed therein. The threshold value used in the disclosed embodiment is 10 mTorr, but the particular threshold value used for any given chamber will typically be dependent on the particular process being performed in that chamber.

Shortly after this further cleaning of the chamber 12, a new reference curve 141 would be generated, and then the chamber would again be returned to production use, with monitoring of the process drift in the chamber being carried out in the same manner already explained above in association with FIG. 6. In general, therefore, the procedure just discussed involves the generation of a new reference curve 141 rather promptly after each wet clean, and then generation of a series of test curves 142 at periodic intervals during use of the chamber, in order to monitor the progressively increasing pressure difference 147. The next wet clean is performed when the difference 147 exceeds the predetermined threshold, and then the process is repeated.

In the disclosed embodiment, it takes about thirty minutes to carry out the successive etching of all of the test wafers needed to generate a curve such as the test curve 142, including measurement of the degree of etching. Then, it takes roughly another fifteen minutes to analyze the resulting information, for example to extrapolate the test curve 142, determine the peak value 144, compare it to the peak value 143 of the reference curve 141 in order to determine the difference 147, and then compare the difference 147 to the predetermined threshold. Consequently, the entire procedure can be performed in less than about one hour.

The present invention provides a number of technical advantages. One such technical advantage is the provision of an inexpensive, fast and reliable way to characterize the pressure drift of a process chamber as it is used over time, and to characterize differences in performance of two or more process chambers that should theoretically have equivalent performances. The ability to accurately identify differences in chamber performance is a significant consideration in a mass production environment. A related advantage is that the process drift is monitored with a high level of accuracy, and the invention permits effective pressure drift to be monitored independently of other factors. A further advantage is that the present invention can be utilized with existing process chambers, without any need for a hardware upgrade such as the addition of a further pressure sensor in the region of the upper electrode assembly, to directly measure the pressure between the upper electrode assembly and the baffle plate. The invention thus avoids the expense of a hardware upgrade, the need to periodically clean the extra sensor involved in the upgrade, and potential inaccuracies in the operation of the sensor due to fluctuations in the plasma caused by a rotating magnetic ring of the process chamber.

Still another advantage is that the present invention avoids premature wet cleaning of a process chamber, thereby avoiding the expense involved with unneeded wet cleaning, including direct costs such as labor and parts, as well as indirect costs such as the unavailability of the chamber for revenue-generating production use. The present invention maximizes the time interval between wet cleans, while virtually eliminating the risk of wafer defects caused by waiting too long to clean a chamber. Still another advantage is that the present invention provides a single procedure which accurately evaluates the effective etch rate of a chamber, without any need for multiple separate etch rate qualifications for each of several different processes.

Although one embodiment has been illustrated and described in detail, it will be understood that the present invention includes various substitutions and alterations which can be made thereto, including those discussed above. In addition to the substitutions and alterations discussed above, it will be recognized that other changes are possible without departing from the spirit and scope of the present invention, as defined by the following claims.

What is claimed is:

1. A method for monitoring process drift in a process chamber, comprising the steps of:

successively introducing a plurality of test wafers into said process chamber, and etching each said test wafer under a respective set of chamber conditions, said sets of chamber conditions being substantially the same except that each involves use of a respective different gas pressure within said chamber;

determining for each said test wafer an effective test etch rate thereof;

extrapolating from said test etch rates and respective said corresponding gas pressures a test curve representing variation of test etch rate relative to gas pressure; and comparing said test curve to a reference curve in order to determine a relative pressure offset therebetween, said pressure offset being representative of a degree of process drift occurring within said chamber.

2. A method according to claim 1, including the steps of comparing said pressure offset to a threshold, and cleaning said chamber if said pressure offset exceeds said threshold.

3. A method according to claim 2, including after said cleaning step the steps of generating a new reference curve, replacing the original reference curve with the new reference curve, and thereafter repeating said steps of introducing, etching, determining, extrapolating and comparing.

4. A method according to claim 3, wherein said step of generating said new reference curve includes the steps of:

successively introducing a plurality of reference wafers into said process chamber and etching each said reference wafer under a respective set of chamber conditions which are substantially the same except that each involves use of a respective different gas pressure within said chamber;

determining for each said reference wafer an effective reference etch rate thereof; and extrapolating from said reference etch rates and respective said corresponding gas pressures the new reference curve representing variation of etch rate relative to gas pressure.

5. A method according to claim 1, including the step of generating said reference curve by carrying out the steps of:

successively introducing a plurality of reference wafers into said process chamber, and etching each said reference wafer under a respective set of chamber conditions which are substantially the same except that each involves use of a respective different gas pressure within said chamber;

determining for each said reference wafer an effective reference etch rate thereof; and extrapolating from said reference etch rates and respective said corresponding gas pressures said reference curve which represents variation of reference etch rate relative to gas pressure.

6. A method according to claim 1, wherein said etching step includes the step of removing a gas mixture from a portion of said chamber which contains said wafer through openings in a baffle plate, and measuring the gas pressure within said chamber at a location disposed on a side of said baffle plate remote from said wafer.

7. A method according to claim 1, wherein said test curve and said reference curve each have a peak value at a location between the ends thereof, and wherein said comparing step includes the steps of identifying said peak value of each of said test curve and said reference curve, and determining said relative pressure offset based on a difference between said peak values of said test and reference curves.

8. A method for matching etch performance in first and second process chambers, comprising the steps of:

successively introducing a plurality of first test wafers into said first process chamber, and etching each said first test wafer under a respective set of chamber conditions, said sets of chamber conditions for said first process chamber being substantially the same except that each involves use of a respective different gas pressure;

successively introducing a plurality of second test wafers into said second process chamber, and etching each said second test wafer under a respective set of chamber conditions, said sets of chamber conditions for said second process chamber being substantially the same except that each involves use of a respective different gas pressure;

determining for each of said first and second test wafers an effective test etch rate thereof;

extrapolating from said test etch rates and respective said corresponding gas pressures for said first test wafers a first test curve representing variation of test etch rate relative to gas pressure for said first chamber;

extrapolating from said test etch rates and respective said corresponding gas pressures for said second test wafers a second test curve representing variation of test etch rate relative to gas pressure for said second chamber; and comparing said first test curve to said second test curve in order to determine a relative offset therebetween which represents an operational difference between said first and second chambers.

9. A method according to claim 8, including the step of adjusting an operational condition of one of said first and second chambers in a manner corresponding to a reduction in said relative offset.

10. A method according to claim 9, including the step of applying a high frequency potential between said first chamber and a wafer therein during operation of said chamber, and the step of applying a high frequency potential between said second chamber and a wafer therein during operation of said second chamber; wherein said relative offset includes a relative etch rate offset between said first and second test curves, and wherein said adjusting step includes the step of adjusting a power level of said high frequency potential for one of said first and second chambers.

11. A method according to claim 9, wherein said relative offset includes a relative pressure offset between said first and second test curves, and wherein said adjusting step includes the step of adjusting an operational pressure used within one of said first and second chambers during operation thereof.

12. A method according to claim 9, including for each of said chambers during operation thereof the steps of removing a gas mixture from a portion of the chamber which contains the wafer through openings in a baffle plate, and measuring the gas pressure within the chamber at a location disposed on a side of said baffle plate remote from the wafer.

13. A method according to claim 8, wherein said first and second test curves each have a peak value at a location between the ends thereof; and wherein said step of comparing said first and second test curves includes the steps of identifying said peak value of each of said test curves, and determining said relative offset based on a difference between said peak values of said test curves.

* * * * *